(12) United States Patent
Song et al.

(10) Patent No.: US 12,105,288 B2
(45) Date of Patent: Oct. 1, 2024

(54) AUGMENTED REALITY LENSES, AND AUGMENTED REALITY GLASSES AND AUGMENTED REALITY SYSTEM INCLUDING THE SAME

(71) Applicant: SAMSUNG ELECTRONICS CO., LTD., Suwon-si (KR)

(72) Inventors: Jongsup Song, Hwaseong-si (KR); Taehyun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 634 days.

(21) Appl. No.: 17/377,629

(22) Filed: Jul. 16, 2021

(65) Prior Publication Data

US 2022/0229296 A1   Jul. 21, 2022

(30) Foreign Application Priority Data

Jan. 20, 2021 (KR) .................. 10-2021-0008006

(51) Int. Cl.
*G02B 27/01*  (2006.01)
*F21V 8/00*  (2006.01)
*G02B 25/00*  (2006.01)
*G02B 26/00*  (2006.01)
*H01L 27/15*  (2006.01)
*H01L 33/48*  (2010.01)
*H01L 33/62*  (2010.01)

(52) U.S. Cl.
CPC ....... *G02B 27/0172* (2013.01); *G02B 6/0076* (2013.01); *G02B 25/001* (2013.01); *G02B 26/00* (2013.01); *H01L 27/153* (2013.01); *H01L 33/486* (2013.01); *H01L 33/62* (2013.01); *G02B 2027/014* (2013.01); *G02B 2027/0178* (2013.01)

(58) Field of Classification Search
CPC ..... H01L 27/153; H01L 27/156; H01L 33/62; H01L 33/486; H01L 25/753; G02B 6/00; G02B 6/0011; G02B 6/0076; G02B 27/01; G02B 27/0101; G02B 27/0107; G02B 27/027; G02B 27/0938; G02B 27/0093; G02B 27/0172; G02B 25/00; G02B 25/001; G02B 25/005; G02B 25/008; G02B 2027/014; G02B 2027/0138; G02B 2027/0178
See application file for complete search history.

(56) References Cited

U.S. PATENT DOCUMENTS

| 8,398,239 B2 | 3/2013 | Horning et al. |
| 10,558,047 B2 | 2/2020 | Samec et al. |
| 10,572,731 B1 | 2/2020 | Ouderkirk |

(Continued)

*Primary Examiner* — Sultan Chowdhury
(74) *Attorney, Agent, or Firm* — Muir Patent Law, PLLC

(57) ABSTRACT

Augmented reality glasses include a left eye lens part and a right eye lens part, each of the left eye lens part and the right eye lens part having a display area configured to display an augmented reality image, and a tracking area surrounding the display area, the tracking area including a plurality of light emission parts configured to emit light having a wavelength in an infrared band, and a frame including a left eye lens support area, a right eye lens support area, and a nose bridge connecting the left lens support area and the right lens support area, the left eye lens support area supporting the left eye lens part, and the right eye lens support area supporting the right eye lens part.

20 Claims, 15 Drawing Sheets

(56) References Cited

U.S. PATENT DOCUMENTS

| | | | |
|---|---|---|---|
| 10,598,941 B1 | 3/2020 | Chi et al. | |
| 10,718,886 B1 | 7/2020 | Sharma et al. | |
| 10,775,616 B1 | 9/2020 | Ouderkirk et al. | |
| 2013/0322810 A1* | 12/2013 | Robbins | G06T 19/006 |
| | | | 385/11 |
| 2017/0329398 A1 | 11/2017 | Raffle et al. | |
| 2019/0187490 A1 | 6/2019 | Dominguez et al. | |
| 2020/0264434 A1* | 8/2020 | Shin | G03H 1/02 |
| 2020/0400962 A1* | 12/2020 | Hirano | G02B 27/30 |
| 2020/0403117 A1* | 12/2020 | Fabien | H01L 25/0753 |
| 2021/0112226 A1* | 4/2021 | Abou | G06F 18/214 |
| 2021/0208395 A1* | 7/2021 | Hwang | G02B 5/3016 |
| 2021/0318540 A1* | 10/2021 | Lee | G02B 19/0047 |

* cited by examiner

Sight direction

AUGMENTED REALITY LENSES, AND AUGMENTED REALITY GLASSES AND AUGMENTED REALITY SYSTEM INCLUDING THE SAME

CROSS-REFERENCE TO THE RELATED APPLICATION

Korean Patent Application No. 10-2021-0008006, filed on Jan. 20, 2021, in the Korean Intellectual Property Office, and entitled: "Augmented Reality Glasses Lenses, and Augmented Reality Glasses and Augmented Reality System Including the Same," is incorporated by reference herein in its entirety.

BACKGROUND

1. Field

Exemplary embodiments relate to augmented reality lenses, and augmented reality glasses and an augmented reality system including the same.

2. Description of the Related Art

In accordance with recent technological advances, wearable devices of various types that are wearable on the body of a user are commercially available. For example, such wearable devices may include a head-mounted display, which is a wearable device wearable on a head of a user. The head-mounted display may provide visual information as to a virtual object through a transparent display and, as such, may provide augmented reality services to the user.

SUMMARY

According to an aspect of the present disclosure, there are provided augmented reality glasses. The augmented reality glasses include a left eye lens part and a right eye lens part; and a frame including a left eye lens support area supporting the left eye lens part, a right eye lens support area supporting the right eye lens part, and a nose bridge interconnecting the left lens support area and the right lens support area, wherein each of the left eye lens part and the right eye lens part includes a display area to display an augmented reality image, and a tracking area in which a plurality of light emission parts to emit light having a wavelength in an infrared band is disposed, the tracking area surrounding the display area.

According to an aspect of the present disclosure, there is provided an augmented reality system. The augmented reality system includes a control appliance including a communication module, and a control part; and augmented reality glasses connected to the communication module through a communication network, to display an augmented reality image and to track positions of pupils of a user under a control of the control part, wherein the augmented reality glasses includes a left eye lens part and a right eye lens part, and a frame including a left eye lens support area supporting the left eye lens part, a right eye lens support area supporting the right eye lens part, and a nose bridge interconnecting the left lens support area and the right lens support area, wherein each of the left eye lens part and the right eye lens part includes a display area to display an augmented reality image, and a tracking area in which a plurality of light emission parts to emit light having a wavelength in an infrared band is disposed, the tracking area surrounding the display area, wherein each of the light emission parts includes a base substrate, a light emitting chip disposed on the base substrate, a first pad and a second pad which are disposed on the light emitting chip while being formed at the same layer, and a filling member formed to cover the light emitting chip.

According to an aspect of the present disclosure, there are provided augmented reality glasses configured to enable a user to visually recognize an object in front of the augmented reality glasses and configured to display an augmented reality image. The augmented reality glasses includes: a first optical lens; a second optical lens including a recess area at one surface thereof; a waveguide disposed between the first optical lens and the second optical lens; and a light emission part disposed between the waveguide and the second optical lens while being positioned in the recess area, wherein the light emission part includes a base substrate including GaAs, a light emitting chip disposed on the base substrate, the light emitting chip being of an epitaxial growth type, a first pad and a second pad which are disposed on the light emitting chip, and a filling member disposed on the light emitting chip, wherein the filling member includes a resin while being formed to cover the light emitting chip and to fill the recess area.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
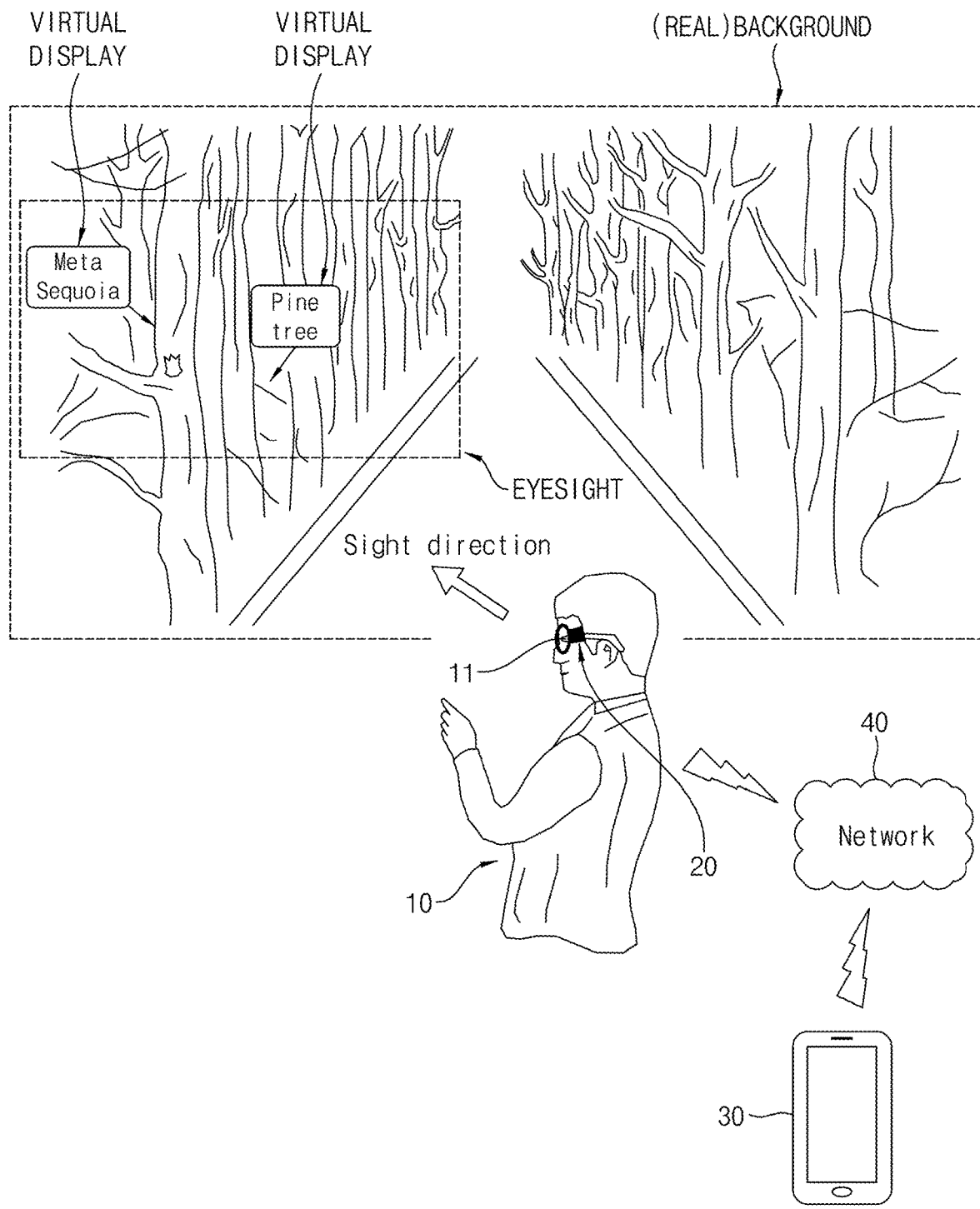
FIG. 1 is a schematic diagram of an augmented reality system according to an exemplary embodiment of the disclosure.

Hereinafter, embodiments will be described with reference to the accompanying drawings. Like reference numerals refer to like elements throughout the specification.

Figure 2:
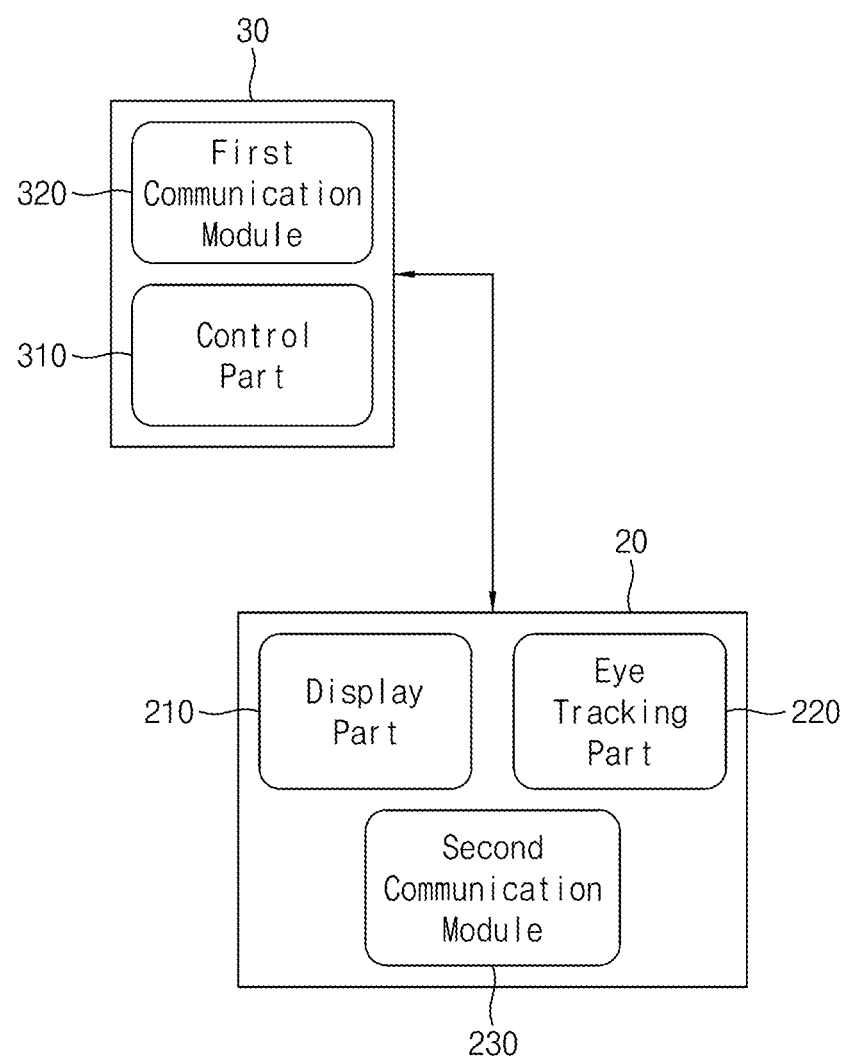
FIG. 2 is a schematic block diagram of the augmented reality system according to the exemplary embodiment of the disclosure.

FIG. 1 is a conceptual diagram schematically showing an augmented reality system according to an exemplary embodiment of the disclosure. FIG. 2 is a schematic block diagram explaining the augmented reality system in FIG. 1.

First, functional characteristics of augmented reality glasses 20 will be described.

Referring to FIGS. 1 and 2, the augmented reality (AR) system may include augmented reality glasses 20, a control appliance 30, and a communication network 40.

The augmented reality glasses 20 may be wearable on the head of a user 10. The augmented reality glasses 20 may be wearable adjacent to eyes 11 of the user 10. Similarly to the case in which the user 10 wears general glasses, the user 10 may visually recognize a real, e.g., physical, background in front of the augmented reality glasses 20, and may receive various display information for execution of a task through the augmented reality glasses 20. The augmented reality glasses 20 may display an augmented reality image, i.e., a virtual image, as the various display information. The augmented reality glasses 20 may display the augmented reality image in an area according to a sight direction of the user 10 (a sight area). The augmented reality image is projected onto augmented reality lenses (e.g., a lens part to be described later). To this end, the augmented reality glasses 20 may include a display panel to display the augmented reality image. The augmented reality lenses may have transmittance for light having wavelengths in the visible spectrum. The user 10 may visually recognize both an augmented reality image displayed by the augmented reality glasses 20 and a background (a real object) in front of the augmented reality glasses 20 in a state in which the augmented reality image and the background are overlapped with each other.

Operation control of the augmented reality glasses 20 may be performed on the basis of the sight direction of the user 10. The augmented reality glasses 20 may determine the sight direction of the user 10, and may display information based on results of the determination.

In an embodiment, the augmented reality glasses 20 may be controlled by the control appliance 30, to which the augmented reality glasses 20 are connected via the communication network 40. In an embodiment, the control appliance 30 may include a first communication module 320 configured to be connected to the communication network 40, and a control part 310 to control the augmented reality glasses 20.

The first communication module 320 included in the control appliance 30 may include a wireless communication module supporting various wireless communication systems, e.g., a Bluetooth module, an infrared communication module, a radio frequency identification (RFID) communication module, a wireless local access network (WLAN) communication module, a near-field communication (NFC) communication module, a Zigbee communication module, a Wi-Fi communication module, a wireless broadband module, a global system for a mobile communication (GSM) module, a code division multiple access (CDMA) module, a wideband code division multiple access (WCDMA) module, a universal mobile telecommunications system (UMTS) module, a time division multiple access (TDMA) module, a long term evolution (LTE) module, a 5G module, etc.

The control part 310 may include hardware and software to execute image processing. For example, the hardware may be embodied in the form of a central processing unit (CPU), a graphics processing unit (GPU), and/or a dedicated processor to execute methods according to exemplary embodiments of the disclosure.

For example, the control appliance 30 may be a wireless appliance able to perform wireless communication, and may be embodied in the form of, e.g., a smartphone, a tablet personal computer (PC), a mobile phone, a smart watch, smart glasses, an e-book reader, a portable game console, a navigation device, a personal digital assistant (PDA), etc.

In an embodiment, the augmented reality glasses 20 may include a display part 210, an eye tracking part 220, and a second communication module 230. The display part 210 and the eye tracking part 220 will be described in detail with reference to FIGS. 3 and 4-6, respectively.

Referring to FIG. 2, the second communication module 230 included in the augmented reality glasses 20 may communicate with the control appliance 30. For example, the second communication module 230 included in the augmented reality glasses 20 may include a wireless communication module supporting the same wireless communication system as the first communication module 320, in order to communicate with the first communication module 320.

Figure 3:
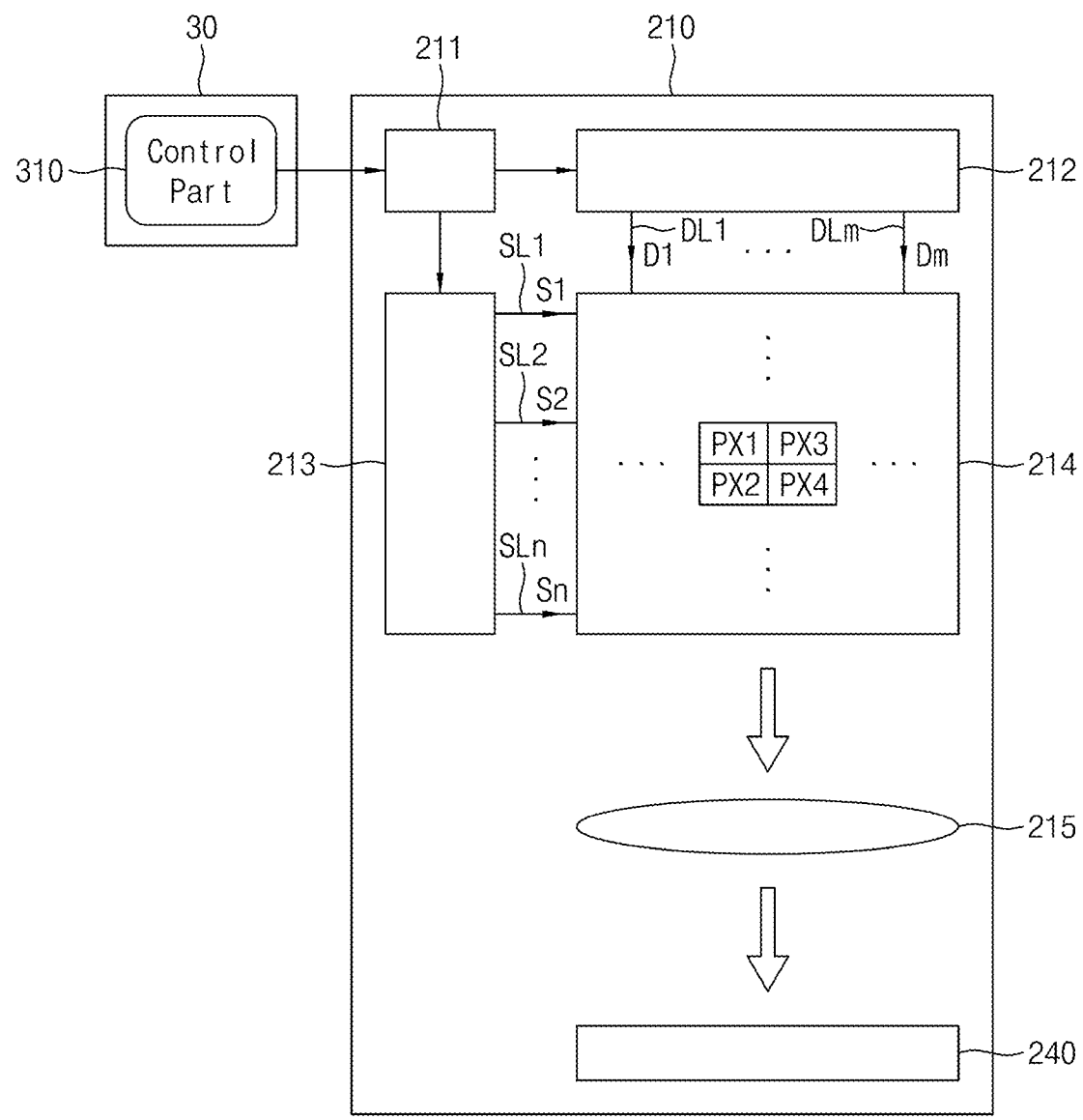
FIG. 3 is a schematic block diagram of a display part of augmented reality glasses according to an exemplary embodiment of the disclosure.

The display part 210 of the augmented reality glasses 20 displays an image to the user 10, as will be described in detail with reference to FIG. 3. FIG. 3 is a schematic block diagram of the display part 210 in the augmented reality glasses 20.

Referring to FIG. 3, the display part 210 may include a pixel part 214, a timing controller 211, a scan driver 213, a data driver 212, an optical element 215, and a waveguide 240.

An augmented reality image means a virtual image output from the pixel part 214 and transferred to the pupils of the user 10 via the optical element 215 and the waveguide 240. The augmented reality image may be a still picture or a moving picture in the form of an image. The user 10 may receive augmented reality services by directly gazing, i.e., via the eyes, on real object image light, which is image light emitted through the display part 210 from a real, e.g., physical, object present in the real world.

The pixel part 214 emits image light corresponding to an augmented reality image. The pixel part 214 may include a plurality of pixels, e.g., pixels PX1 to PX4. The pixel part 214 may include a plurality of pixels, e.g., pixels PX1 to PX4, respectively disposed in areas defined by scan lines SL1 to SLn (n being a natural number greater than 1) and data lines DL1 to DLm (m being a natural number greater than 1). For example, the plurality of pixels may include pixels PX1 to PX4 respectively emitting image light of red, green and blue. In some embodiments, the plurality of pixels may include pixels PX1 to PX4 respectively emitting image light of white, cyan, magenta and yellow.

The timing controller 211 may provide data values, a control signal, etc. for each frame to the data driver 212, based on data received from the control part 310. In addition, the timing controller 211 may provide a clock signal, a control signal, etc. to the scan driver 213, based on data received from the control part 310. The timing controller 211 disposed in the augmented reality glasses 20 may be controlled by the control part 310 disposed in the control appliance 30. For example, the control part 310 disposed at the control appliance 30 may control the timing controller 211 through wireless connection thereof to the augmented reality glasses 20.

The scan driver 213 may sequentially supply scan signals S1 to Sn to the scan lines SL1 to SLn. The data driver 212 may supply data signals D1 to Dm to the data lines DL1 to DLm every time the scan signals S1 to Sn are supplied.

For example, the pixel part 214, the scan driver 213, and the data driver 212 may be embodied together as a display panel in the form of a liquid crystal on silicon (LCOS) display panel, a liquid crystal display panel, an organic light emitting diode (OLED) display panel, a micro LED display panel, a plasma display panel, an electrophoretic display panel, a micro-electromechanical system (MEMS) display panel, an electrowetting display panel, an image projector, or the like.

The optical element 215 may reflect, refract, or diffract image light output from the pixel part 214, and may transfer the resultant image light to the waveguide 240. The optical element 215 may use various optical elements constituted by a reflection device, a refraction device, a diffraction device, or a combination thereof. For example, the optical element 215 may include a convex or concave lens, a mirror, or the like. For example, in accordance with embodiments, the display part 210 may further include a collimator between the pixel part 214 and the optical element 215.

Image light output from the optical element 215 may be transferred to the waveguide 240. In an embodiment, the waveguide 240 may employ a configuration in which total reflection is carried out at least one time at an inner surface of the waveguide 240. In some embodiments, when the waveguide 240 does not employ a total reflection structure, the waveguide 240 may include a separate reflection means, and may be disposed at an appropriate position for transfer of image light to the eyes 11 (pupils).

The waveguide 240 is an element made of a transparent material, e.g., a see-through material. The waveguide 240 may include a plurality of areas formed with diffraction gratings. A virtual image projected into the waveguide 240 may be reflected in the waveguide 240 in accordance with a total reflection principle. Image light projected from the pixel part 214 into the waveguide 240 changes its optical path by the refraction gratings formed at the plurality of areas of the waveguide 240 and, as such, may output a virtual object to the eyes 11 of the user 10. The waveguide 240 may function as a light guide plate to change an optical path of the image light.

Figure 4:
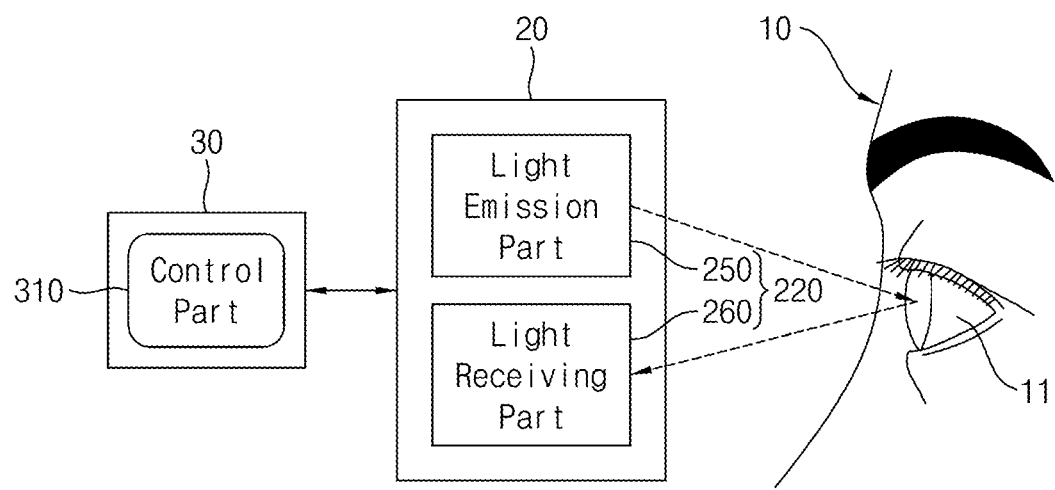
FIG. 4 is a schematic block diagram of an eye tracking part of augmented reality glasses according to an exemplary embodiment of the disclosure.
Figure 5:
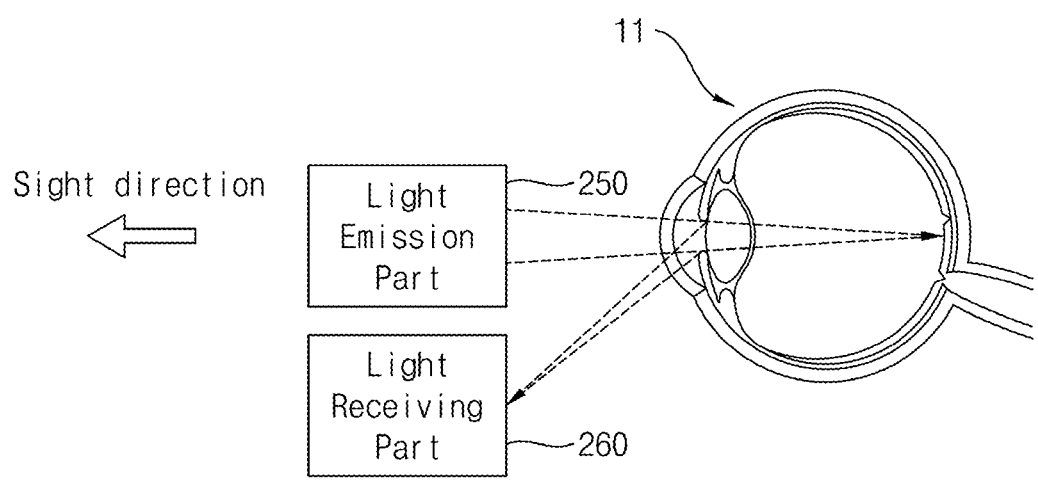
FIG. 5 is a diagram of a method in which the eye tracking part of FIG. 4 adjusts a focal point.
Figure 6:
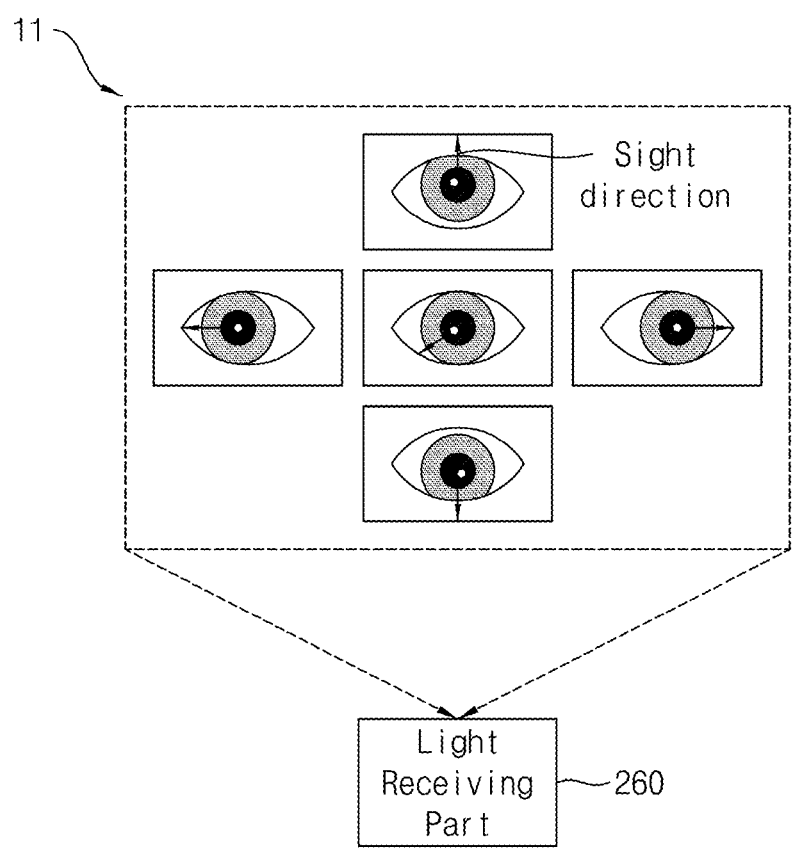
FIG. 6 is a diagram of a method in which the eye tracking part of FIG. 4 tracks sight.

FIG. 4 is a schematic block diagram of the eye tracking part 220 of the augmented reality glasses 20. FIG. 5 is a diagram of a method in which the eye tracking part 220 adjusts a focal point, and FIG. 6 is a diagram of a method in which the eye tracking part 220 tracks sight.

Referring to FIG. 2 and FIGS. 4 to 6, the augmented reality glasses 20 may attain sight vectors respectively representing sight directions of the user 10 by tracking positions of pupils in the eyes 11 of the user 10. For example, the augmented reality glasses 20 may attain the sight vectors of the user 10 through technology for detecting a sight direction using reflection of infrared light from a cornea.

In an embodiment, the eye tracking part 220 may include a light emission part 250 and a light receiving part 260. In an embodiment, the light emission part 250 may irradiate cornea portions of the eyes 11 (left and right eyes; both eyes) of the user 10 with infrared light, whereas the light receiving part 260 may detect the infrared light reflected from the cornea portions.

In detail, the eye tracking part 220 may determine sight directions, in which both eyes of the user 10 gaze, respectively, based on amounts of infrared light detected through the light receiving part 260 and, as such, may attain sight vectors respectively representing the sight directions. The eye tracking part 220 may transmit the attained sight vectors to the control part 310. The control part 310 may attain respective sight vectors of the left and right eyes, and may estimate a position of a gaze point at which the user 10 gazes through both eyes, based on the attained sight vectors. In an embodiment, the control part 310 may calculate three-dimensional position coordinate values of the gaze point based on the sight vectors. In an embodiment, the control part 310 may determine positions of focal points of the left and right eyes based on the three-dimensional position coordinate values of the gaze point.

In an embodiment, the light receiving part 260 may be embodied in the form of an image sensor, e.g., an infrared camera. The light receiving part 260 may attain a video and a still image by photographing a physical environment or space. The light receiving part 260 may transmit the attained video data and the attained still image to the control part 310. The light receiving part 260 may attain a pupil image based on an amount of infrared light. For example, the eye tracking part 220 may attain images of the pupils using vision technology, may track a variation in positions of the pupils based on the attained images, and may attain sight vectors based on the tracked position variation.

Hereinafter, structural characteristics of the augmented reality glasses 20 will be described. In the description of the structural characteristics of the augmented reality glasses 20, elements having the same functions as the elements previously described in conjunction with the functional characteristics of the augmented reality glasses 20 are designated by the same names or the same reference numerals.

Figure 7:
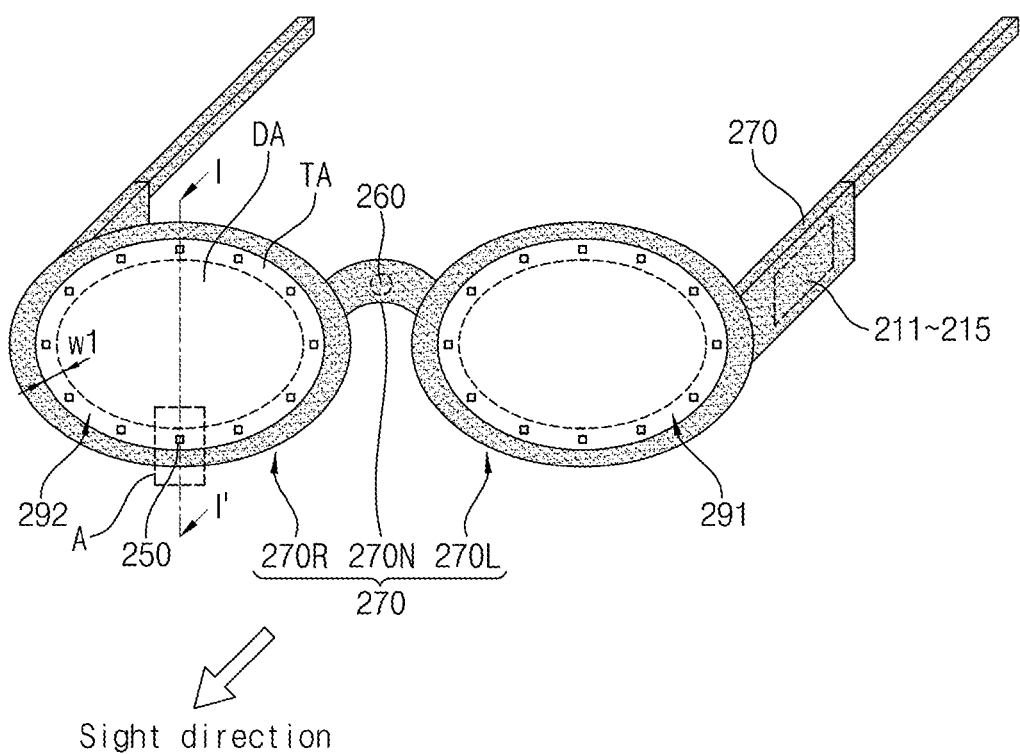
FIG. 7 is a schematic perspective view of augmented reality glasses according to an exemplary embodiment of the disclosure.
Figure 8:
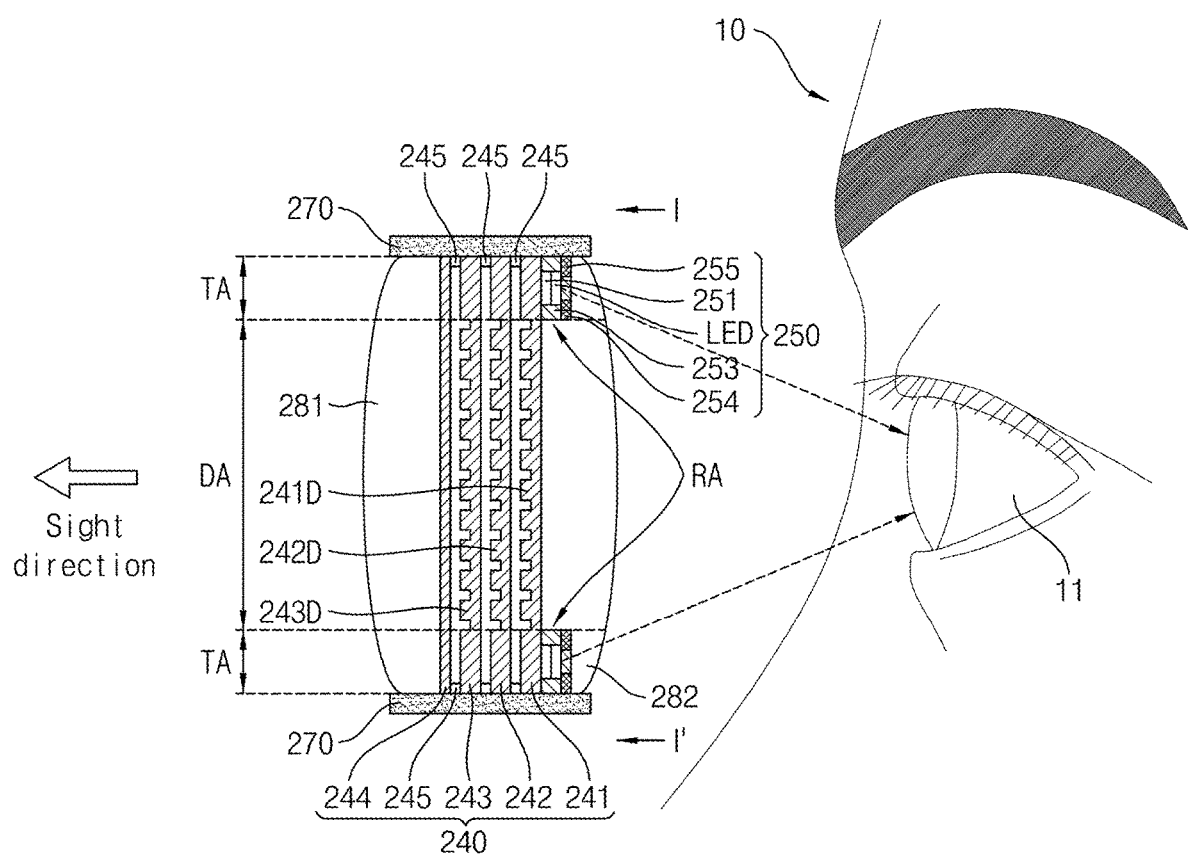
FIG. 8 is a cross-sectional view along line I-I' in FIG. 7.

FIG. 7 is a schematic perspective view of the augmented reality glasses 20 according to an exemplary embodiment. FIG. 8 is a cross-sectional view of the augmented reality glasses 20 along line I-I' in FIG. 7.

Referring to FIGS. 7 and 8, in an embodiment, the augmented reality glasses 20 may include a left eye lens part 291, a right eye lens part 292, a frame 270, a light emission part 250, and a light receiving part 260. In addition, the timing controller 211, the data driver 212, the scan driver 213, the pixel part 214, and the optical element 215 described above with reference to FIG. 3 may be disposed in an interior of the frame 270, e.g., interior of the sides of the frame in FIG. 7 indicated as 211~215.

The left eye lens part 291 and the right eye lens part 292 have symmetrical shapes, respectively, and, as such, the following description will be given with reference to the right eye lens part 292. The structures of the left eye lens part 291 and the right eye lens part 292 are substantially the same, and therefore, overlapping descriptions of the left eye lens part 291 and the right eye lens part 292 will be omitted. In the following description, the left eye lens part 291 and the right eye lens part 292 will be collectively referred to as a "lens part 291/292".

At least a portion of the entire area of the lens part 291/292 may be transparent. The user 10 may visually recognize an object in front of the lens part 291/292 through the area portion. The lens part 291/292 may have transmittance for light having wavelengths in the visible spectrum.

The lens part 291/292 may include a display area DA for displaying an augmented reality image, and a tracking area TA at which a plurality of light emission parts 250 is disposed. In accordance with embodiments, the tracking area TA may be a non-display area in which no augmented reality image is displayed.

The tracking area TA may be disposed at an edge of the lens part 291/292. The tracking area TA may surround the, e.g., entire perimeter of the, display area DA. In an embodiment, a width w1 of the tracking area TA extending inward from the edge of the lens part 291/292 may be about 2 mm or less, e.g., the tracking area TA may have a constant width measured radially between an outer edge of the display area DA and an outer edge of the lens part 291/292. The display area DA may be disposed inside the tracking area TA, e.g., the display area DA may be centered in and completely surrounded by the tracking area TA.

In an embodiment, the lens part 291/292 may include the waveguide 240, a first optical lens 281 disposed at a front surface of the waveguide 240, and a second optical lens 282 disposed at a back surface of the waveguide 240. In the specification, for convenience of description of the lens part 291/292, it is assumed that, in an element having opposite surfaces, the surface of the element disposed in a sight direction of the user 10 when the user 10 wears the augmented reality glasses 20 is defined as a front surface, and the surface of the element disposed in a direction opposite to the sight direction (i.e., to face the eyes 11) is defined as a back surface.

For example, as illustrated in FIG. 8, a front surface of the first optical lens 281 may be a curved surface, e.g., a convex surface relative to the waveguide 240, and a back surface of the first optical lens 281, which is a surface contacting the front surface of the waveguide 240, may be a flat surface. In another example, the front surface of the first optical lens 281 may be a flat surface. In an embodiment, when the user 10 wears the augmented reality glasses 20, the second optical lens 282 may be disposed nearer to the eyes 11 of the user 10 than the first optical lens 281, e.g., a distance between the second optical lens 282 and the eyes 11 of the user 10 may be smaller than a distance between the first optical lens 281 and the eyes 11 of the user 10.

For example, a front surface of the second optical lens 282, which is a surface contacting the back surface of the waveguide 240, may be a flat surface, and a back surface of the second optical lens 282 may be a curved surface, e.g., a convex surface relative to the waveguide 240. In another example, the back surface of the second optical lens 282 may be a flat surface.

The second optical lens 282 may include, at an edge of the front surface thereof, a recess area RA in which a light emission part 250 is disposed. For example, as illustrated in FIG. 8, the recess area RA may extend only partially into the second optical lens 282, e.g., a thickness of the recess area RA as measured in the sight direction may be smaller than a distance between the front and back surfaces of the second optical lens 282 in the tracking area TA. For example, as further illustrated in FIG. 8, the recess area RA may extend to an outermost edge of the second optical lens 282. The recess area RA may be disposed between the second optical lens 282 and the waveguide 240. For example, referring to FIGS. 7 and 8, the recess area RA may extend, e.g., continuously, along an entire outer edge of the second optical lens 282, such that the recess area RA may be positioned between an edge of the waveguide 240 and an edge of the second optical lens 282 to overlap the edges of the waveguide 240 and the second optical lens 282 in the tracking area TA. The recess area RA may overlap with the tracking area TA, e.g., the recess area RA and the tracking area TA may completely overlap each other along the sight direction. The recess area RA of the front surface of the second optical lens 282 may contact the light emission part 250, whereas the remaining area of the front surface of the second optical lens 282 (e.g., an area overlapping with the display area DA, and an area portion, in which the recess area RA is not present, from among portions of an area overlapping with the tracking area TA) may contact the waveguide 240.

In an embodiment, the first optical lens 281 may not include the recess area RA, differently from the second optical lens 282.

At least one of the first optical lens 281 and the second optical lens 282 may include the function of a focusing lens. For example, the first optical lens 281 and/or the second optical lens 282 may be a convex lens, a concave lens, or a planar lens. Although either the first optical lens 281 or the second optical lens 282 is shown as being a convex lens in FIG. 8 in accordance with an embodiment, the exemplary embodiments of the disclosure are not limited thereto. When the first optical lens 281 or the second optical lens 282 is a convex lens or a concave lens, the convexness or concaveness of the first optical lens 281 or the second optical lens 282 may be adjusted in accordance with the eyesight of the user 10.

The waveguide 240 may be disposed between the first optical lens 281 and the second optical lens 282. In an embodiment, the waveguide 240 may include a plurality of guides. For example, the waveguide 240 may include a first guide 241, a second guide 242, a third guide 243, and a cover guide 244.

In an embodiment, the second guide 242 may be disposed on a front surface of the first guide 241, the third guide 243 may be disposed on a front surface of the second guide 242, and the cover guide 244 may be disposed on a front surface of the third guide 243. A back surface of the first guide 241 may face the second optical lens 282. Spacers 245 may be disposed between adjacent ones of the first guide 241, the second guide 242, the third guide 243, and the cover guide 244, respectively. The spacers 245 may overlap with the tracking area TA. Adjacent ones of the first guide 241, the second guide 242, the third guide 243, and the cover guide 244 may be spaced apart from each other by a predetermined distance under the condition that a corresponding one of the spacers 245 is interposed therebetween.

In an embodiment, each of the first guide 241, the second guide 242, and the third guide 243 may include, at one surface (or both surfaces) thereof, a corresponding one of diffraction gratings 241D, 242D and 243D. The diffraction gratings 241D, 242D and 243D may totally reflect light within the waveguide 240. In addition, each of the diffraction gratings 241D, 242D and 243D may output light to the outside of the waveguide 240, corresponding to a predetermined area of the waveguide 240. In addition, each of the diffraction gratings 241D, 242D and 243D may adjust the refraction order of light output to the outside of the waveguide 240. In accordance with embodiments, the diffraction gratings 241D, 242D and 243D may include a wire grid polarizer (WGP), e.g., the diffraction gratings 241D, 242D and 243D may overlap each other and the display area DA.

In an embodiment, one of the first guide 241, the second guide 242, and the third guide 243 may selectively output red light to the outside of the waveguide 240, another one thereof may output green light to the outside of the waveguide 240, and the remaining one thereof may output blue light to the outside of the waveguide 240. For example, the wavelength of red light may be about 620 nm to about 750 nm, the wavelength of green light may be about 495 nm to about 570 nm, and the wavelength of blue light may be about 450 nm to about 495 nm.

The cover guide 244 may include a function for protecting the first guide 241, the second guide 242, and the third guide 243. In an embodiment, the cover guide 244 may have a uniform thickness.

The frame 270 may be a supporter mounted to a head portion of the user 10 when the user 10 wears the augmented reality glasses 20. In the interior of the frame 270, electrical wirings for electrical connection among the timing controller 211, the scan driver 213, the data driver 212, the pixel part 214, the optical element 215, the light emission part 250, and the light receiving part 260 may be mounted.

As illustrated in FIG. 7, the frame 270 may support (or fix) the left eye lens part 291 and the right eye lens part 292. The frame 270 may include a left eye lens support area 270L and a right eye lens support area 270R. The left eye lens support area 270L and the right eye lens support area 270R may fix the left eye lens part 291 and the right eye lens part 292, respectively. The left eye lens support area 270L and the right eye lens support area 270R may surround at least parts of edges of the left eye lens part 291 and the right eye lens part 292, respectively, e.g., the left and right eye lens support areas 270L and 270R may completely surround perimeters of the respective left and right eye lens parts 291 and 292 (dark round portions in FIG. 7).

In an embodiment, the frame 270 may further include a nose bridge 270N. The nose bridge 270N, which is a supporter interconnecting the left eye lens support area 270L and the right eye lens support area 270R, may support a nose portion of the user 10 when the user 10 wears the augmented reality glasses 20. For example, a microphone, which records sound and transmits a recorded sound signal to the control part 310, may be mounted in the nose bridge 270N.

In an embodiment, the light receiving part 260 may be mounted in the frame 270. For example, the light receiving part 260 may be disposed in the nose bridge 270N, e.g., for detecting the amount of infrared light reflected back from the cornea.

For example, as illustrated in FIG. 7, the nose bridge 270N is included in the frame 270 and, as such, is integrated with the left eye lens support area 270L and the right eye lens support area 270R, e.g., as a seamless integrated structure. In another example, the nose bridge 270N may have a structure separated from the frame 270.

Figure 9:
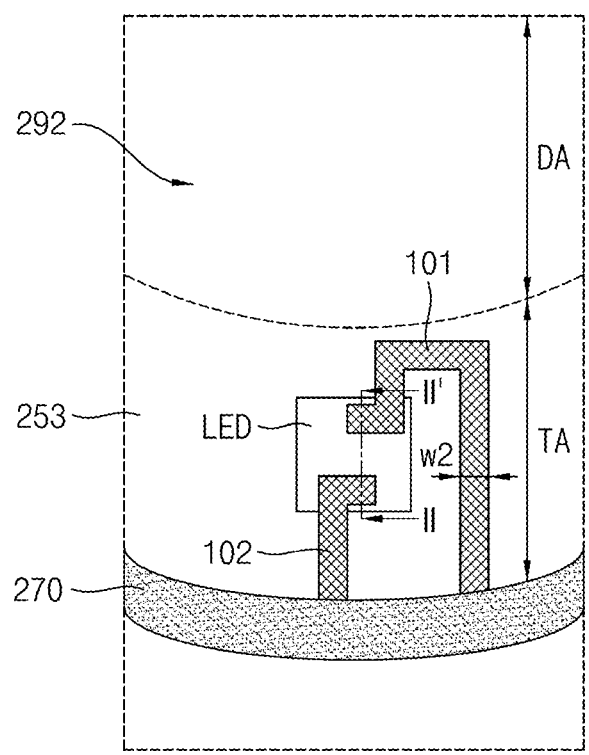
FIG. 9 is an enlarged view of portion A in FIG. 7.
Figure 10:
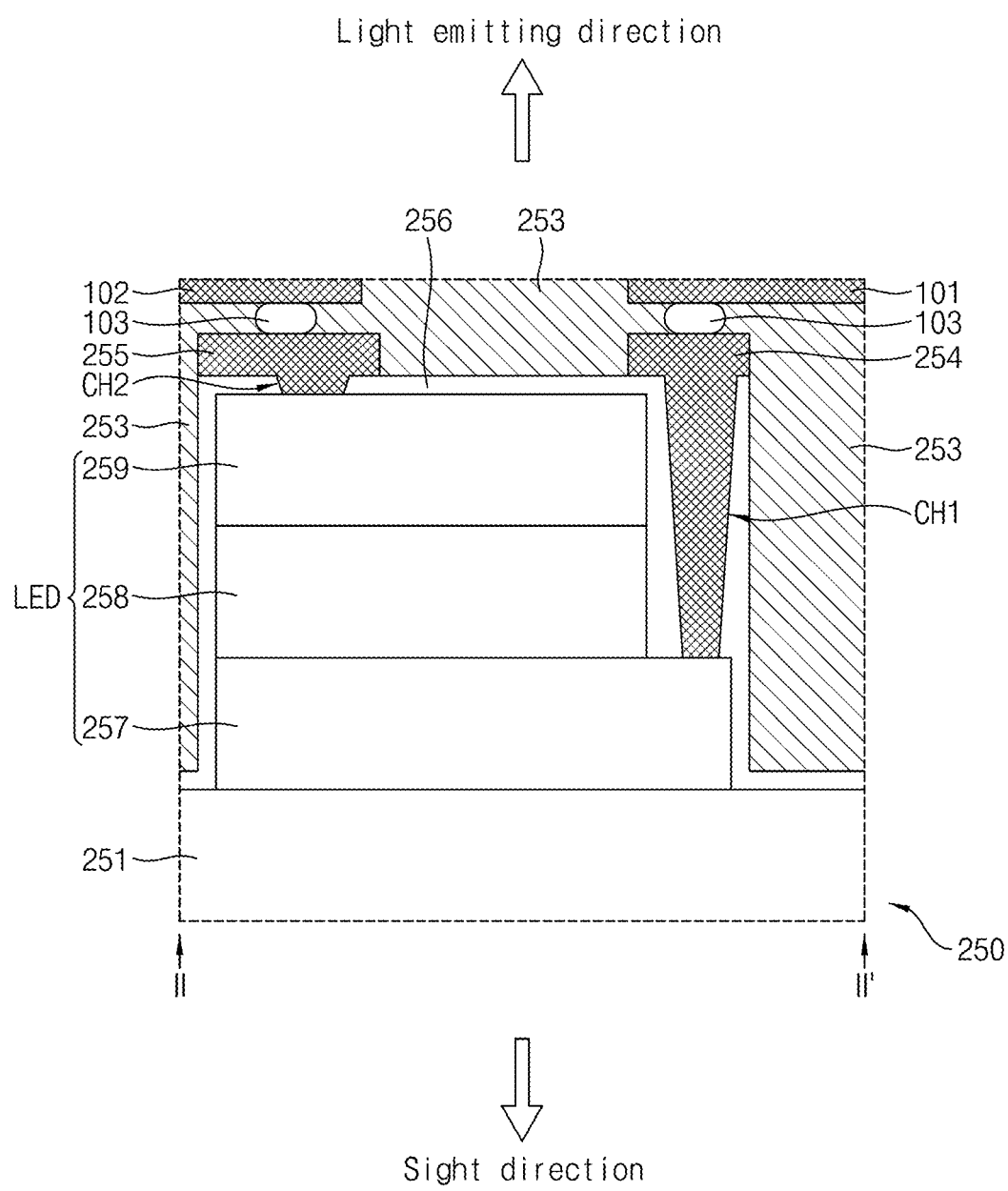
FIG. 10 is a cross-sectional view along line II-IF in FIG. 9.

Hereinafter, the light emission part 250 in the frame 270 will be described in detail with reference to FIGS. 9 and 10. FIG. 9 is an enlarged view of portion A of FIG. 7, and FIG. 10 is a cross-sectional view along line II-IF in FIG. 9.

Referring to FIGS. 7 to 10, the light emission part 250 may include a base substrate 251, a light emitting chip LED disposed on the base substrate 251, an insulating layer 256, first and second pads 254 and 255 connected to the light emitting chip LED, and a filling member 253. In an embodiment, the light emission part 250 may be disposed in the recess area RA formed at the edge of the front surface of the second optical lens 282. For example, referring to FIGS. 7 and 8, a plurality of light emission parts 250 may be spaced apart from each other along an entire perimeter of the tracking area TA (e.g., the small squares along the tracking area TA in FIG. 7 indicating a light emitting chip LED in each of the light emission parts 250 to be described below).

In detail, the base substrate 251 may be disposed in the recess area RA (on the front surface of the second optical lens 282), e.g., the base substrate 251 may be directly on the back surface of the first guide 241 in the tracking area TA.

For example, the base substrate 251 may be a material suitable for growth of a semiconductor, a carrier wafer, or the like. For example, the base substrate 251 may be a transparent substrate, e.g., the material of the base substrate 251 may include GaAs. In another example, the base substrate 251 may include a material (or an opaque material) such as sapphire ($Al_2SO_4$), Si, SiC, GaN, ZnO, etc.

The light emitting chip LED may be disposed on one surface, e.g., directly on the back surface, of the base substrate 251. The light emitting chip LED may include an n-type semiconductor layer 257, a light emitting layer 258, and a p-type semiconductor layer 259. In an embodiment, the light emitting chip LED may be of an epitaxial growth type.

The n-type semiconductor layer 257 may be disposed on the base substrate 251. The n-type semiconductor layer 257 may be grown on the base substrate 251. In detail, growth of the n-type semiconductor layer 257 may be achieved by deposition technology, e.g., a metal organic chemical vapor deposition (MOCVD), a metal organic vapor phase epitaxy (MOVPE), or a molecular beam epitaxy (MBE).

The light emitting layer 258 and the p-type semiconductor layer 259 may be sequentially disposed on the n-type semiconductor layer 257. Here, deposition technology for growing the light emitting layer 258 and the p-type semiconductor layer 259 may be identical to the above-described deposition technology for the n-type semiconductor layer 257.

For example, the n-type semiconductor layer 257 and the p-type semiconductor layer 259 may be embodied using a group III-V, group II-VI, etc. compound semiconductor. In some embodiments, each of the n-type semiconductor layer 257 and the p-type semiconductor layer 259 may be embodied as a nitride semiconductor layer. For example, the n-type semiconductor layer 257 and the p-type semiconductor layer 259 may be an n-GaN semiconductor layer and a p-GaN semiconductor layer, respectively. However, the n-type semiconductor layer 257 and the p-type semiconductor layer 259 according to this embodiment are not limited to the above-described conditions, and may be made of any suitable materials in accordance with diverse characteristics required in an LED device.

An n-type semiconductor is a semiconductor in which free electrons are used as carriers for transferring charges, and may be formed by doping with an n-type dopant, e.g., Si, Ge, Sn, Te, etc. A p-type semiconductor is a semiconductor in which holes are used as carriers for transferring charges, and may be formed by doping a p-type dopant, e.g., Mg, Zn, Ca, Ba, etc.

In an embodiment, a certain region of the n-type semiconductor layer 257 may not overlap with a region in which the p-type semiconductor layer 259 is disposed.

In an embodiment, the light emitting layer 258 is a layer which is disposed between the n-type semiconductor layer 257 and the p-type semiconductor layer 259, and in which carriers of the n-type semiconductor layer 257, i.e., electrons, and carriers of the p-type semiconductor layer 259, i.e., holes, meet. When electrons and holes meet in the light emitting layer 258, a potential barrier is formed in accordance with re-combination of the electrons and the holes. When the electrons and holes transition to a low energy level while crossing the potential barrier in accordance with an applied voltage, light having a wavelength corresponding to the low energy level is emitted. For example, the light emitting layer 258 may emit light having a wavelength in an infrared band.

In an embodiment, the light emitting layer 258 may have a multi-quantum well (MQW) structure, but the exemplary embodiments of the disclosure are not limited thereto. The light emitting layer 258 may have various structures such as single-quantum well (SQW) structure, a quantum dot (QD) structure, etc. When the light emitting layer 258 is formed to have a multi-quantum well structure, a well layer/barrier layer of the light emitting layer 258 may be formed to have a structure such as InGaN/GaN, InGaN/InGaN, or GaAs (InGaGs)/AlGaAs, but the exemplary embodiments of the disclosure are not limited thereto. In addition, the number of quantum wells included in the light emitting layer 258 is not limited to a particular number.

The insulating layer 256 may be disposed on the light emitting chip LED. In an embodiment, the insulating layer 256 may be a passivation layer. For example, the insulating layer 256 may be made of an insulating material such as $Al_2O_3$, SiN or $SiO_2$.

In an embodiment, the first pad 254 and the second pad 255 may be disposed on the insulating layer 256. The first pad 254 and the second pad 255 may be disposed at the same level, e.g., directly on a same layer. The first pad 254 and the second pad 255 may be disposed to be spaced apart from each other. The first pad 254 may be electrically connected to the n-type semiconductor layer 257. For example, the first pad 254 may be connected to the n-type semiconductor layer 257 while extending through the insulating layer 256 via a first contact hole CH1 exposing a region of the n-type semiconductor layer 257 not overlapping with the region the p-type semiconductor layer 259. The second pad 255 may be connected to the p-type semiconductor layer 259 while extending through the insulating layer 256 via a second contact hole CH2 exposing the p-type semiconductor layer 259. In an embodiment, the first pad 254 and the second pad 255 may be an opaque metal including Ag, Ni, Cu, Sn, Au, or the like, or may be a transparent metal including ITO, IZO, ZnO or the like.

In an embodiment, the augmented reality glasses 20 may further include a first wiring 101, a second wiring 102, and bumps 103. The first wiring 101 may be electrically connected to the first pad 254, and the second wiring 102 may be electrically connected to the second pad 255. The first wiring 101 and the second wiring 102 may extend into the interior of the frame 270.

The bumps 103 may be directly disposed on the first pad 254 and the second pad 255. The first wiring 101 and the second wiring 102 may be disposed on the bumps 103. The first wiring 101 and the second wiring 102 may be disposed at the same level, e.g., directly on a same layer. The first wiring 101 and the second wiring 102 may be disposed to be spaced apart from each other. The bumps 103 may be disposed between the first pad 254 and the first wiring 101, and between the second pad 255 and the second wiring 102, respectively. The first wiring 101 may be electrically connected to the first pad 254 through a corresponding one of the bumps 103. The second wiring 102 may be electrically connected to the second pad 255 through a corresponding one of the bumps 103. In an embodiment, a planar width w2 of each of the first wiring 101 and the second wiring 102 may be about 50 μm to about 150 μm.

In an embodiment, the bumps 103 may include a metal, e.g., Ag epoxy or SAC epoxy. A material included in the bumps 103 may have a relatively low melting point. In an embodiment, the first wiring 101 and the second wiring 102 may be an opaque metal, e.g., including Ag, Ni, Cu, Sn, Au, or the like, or may be a transparent metal, e.g., including ITO, IZO, ZnO or the like.

In an embodiment, the light emitting chip LED may be of an n-type front emission type. For example, the light emitting chip LED may emit light in a stack direction of the n-type semiconductor layer 257, the light emitting layer 258, and the p-type semiconductor layer 259. The light emitting chip LED may directly emit infrared light in a direction toward the eyes 11 of the user 10 (dashed arrows in FIG. 8), i.e., the infrared light emitted toward the cornea of the user for detecting a sight direction.

The filling member 253 may fill the recess area. In an embodiment, the filling member 253 may substantially fill the recess area without forming a gap. For example, the filling member 253 may be disposed on the insulating layer 256. For example, the filling member 253 may be formed to cover a top portion of the light emitting chip LED and an edge of the light emitting chip LED. For example, the filling member 253 may be filled between the second optical lens 282 and the light emitting chip LED without forming a gap, except for a portion of the space where the insulating layer 256 is formed.

In an embodiment, the filling member 253 may include a transparent resin. The transparent resin may transmit light having wavelengths in the visible and infrared bands therethrough. Since the filling member 253 is filled between the second optical lens 282 and the light emitting chip LED without forming a gap, respective refraction index differences between the light emitting chip LED and the filling member 253, and between the filling member 253 and the second optical lens 282 may be relatively small.

Next, augmented reality glasses according to another exemplary embodiment of the disclosure will be described. In the following description, no description will be given of constituent elements identical to those of FIGS. 1 to 10, and the constituent elements will be designated by reference numerals identical or similar to those of FIGS. 1 to 10.

Figure 11:
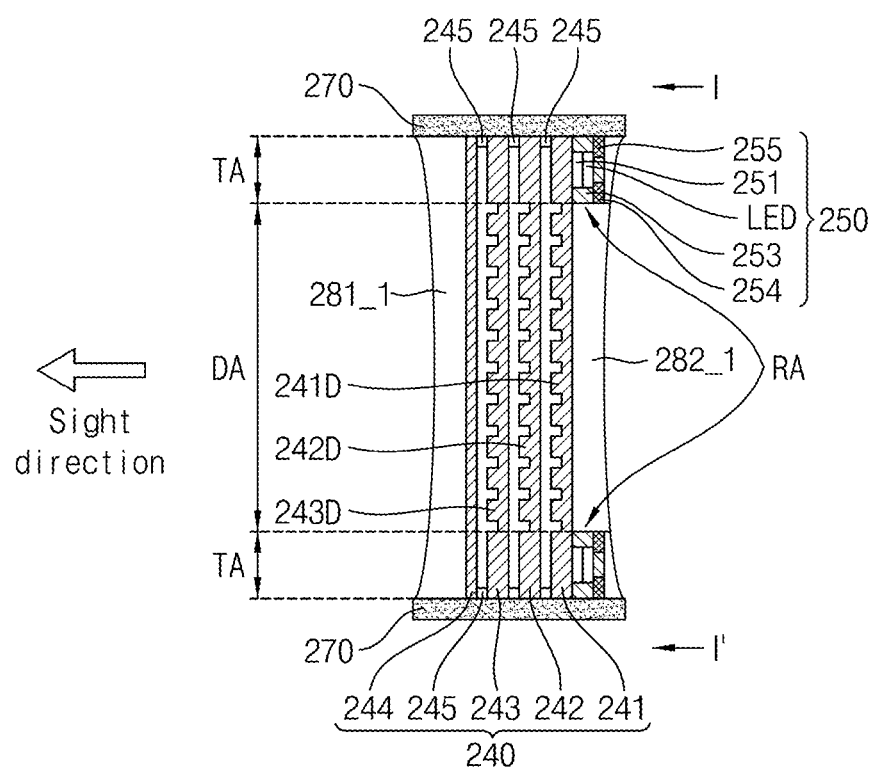
FIG. 11 is a cross-sectional view of augmented reality glasses according to an exemplary embodiment of the disclosure.

FIG. 11 is a cross-sectional view of a certain area of augmented reality glasses according to an exemplary embodiment of the disclosure.

Referring to FIG. 11, the augmented reality glasses according to this embodiment differ from the augmented reality glasses 20 according to the embodiment of FIG. 8 in that a first optical lens 281_1 and a second optical lens 282_2 are concave lenses, respectively. That is, in an embodiment, a front surface of the first optical lens 281_1 may be a curved surface, and a back surface of the first optical lens 281_1, which contacts a front surface of a waveguide 240, may be a flat surface. A front surface of the second optical lens 282_2 may be a flat surface including a recess area at an edge thereof, and a back surface of the second optical lens 282_2 may be a curved surface.

Figure 12:
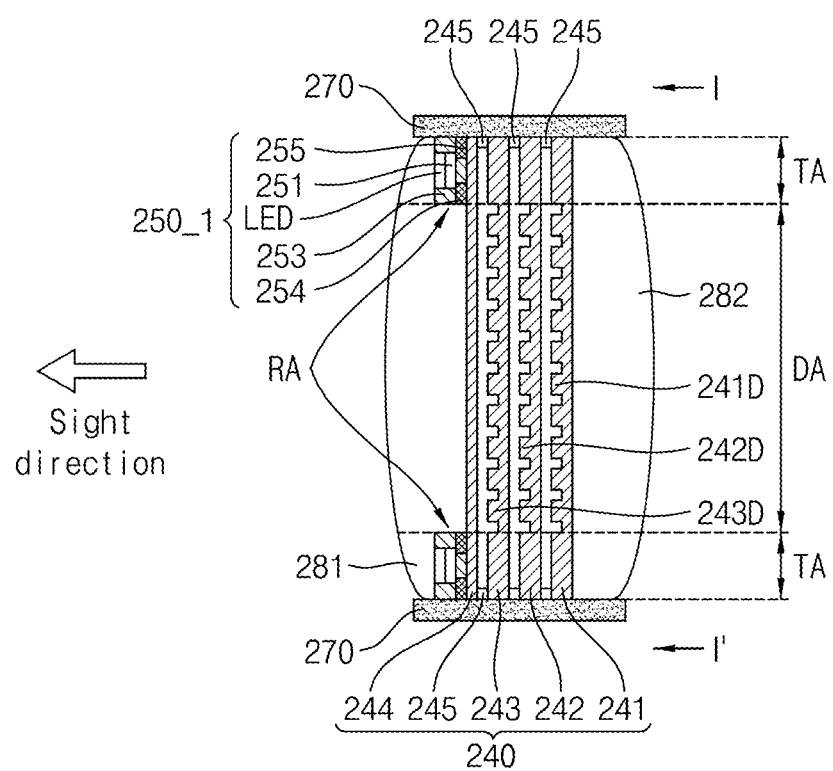
FIG. 12 is a cross-sectional view of augmented reality glasses according to an exemplary embodiment of the disclosure.
Figure 13:
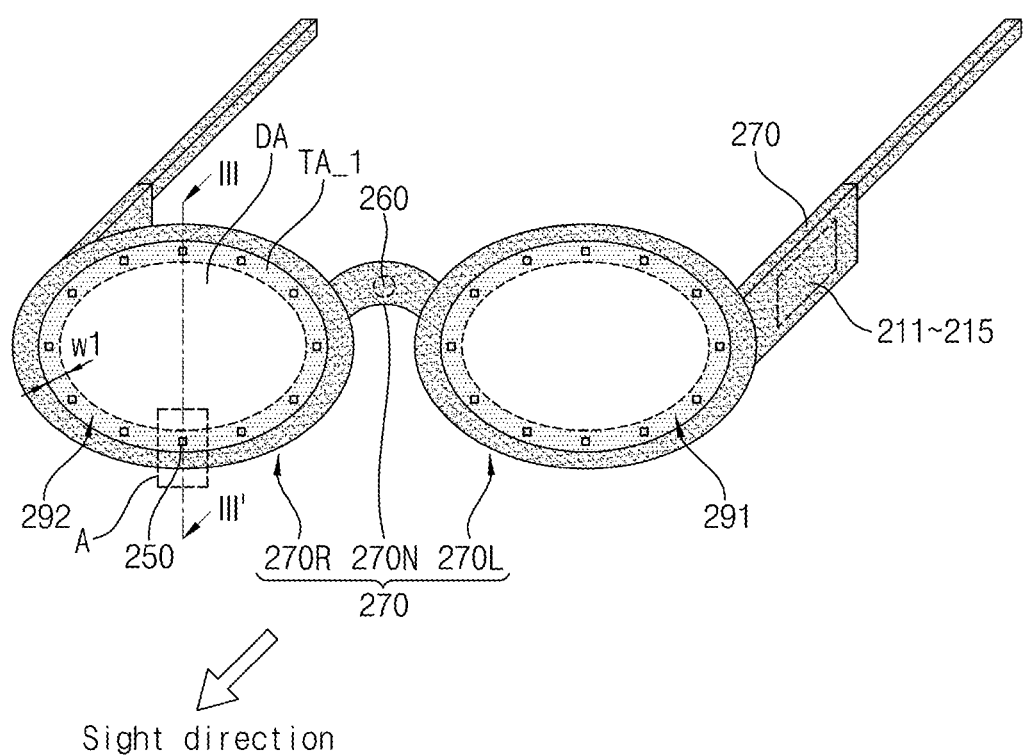
FIG. 13 is a schematic perspective view of augmented reality glasses according to an exemplary embodiment of the disclosure.
Figure 14:
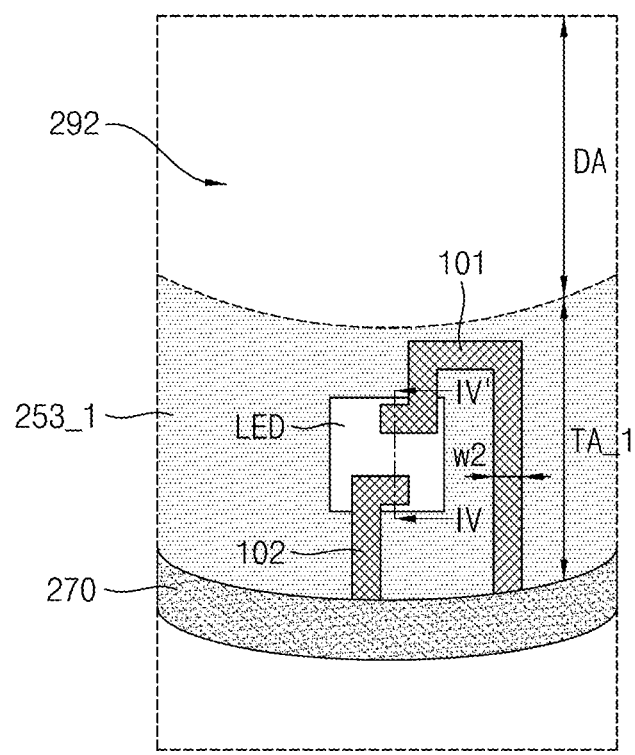
FIG. 14 is a cross-sectional view along line in FIG. 13.
Figure 15:
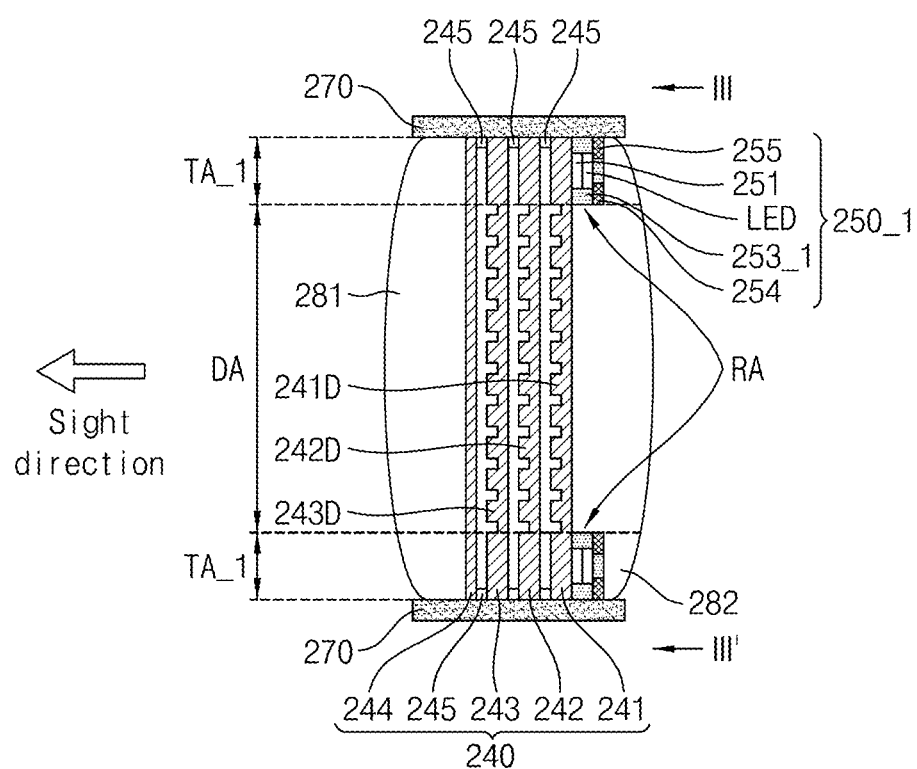
FIG. 15 is an enlarged view of portion A in FIG. 13.
Figure 16:
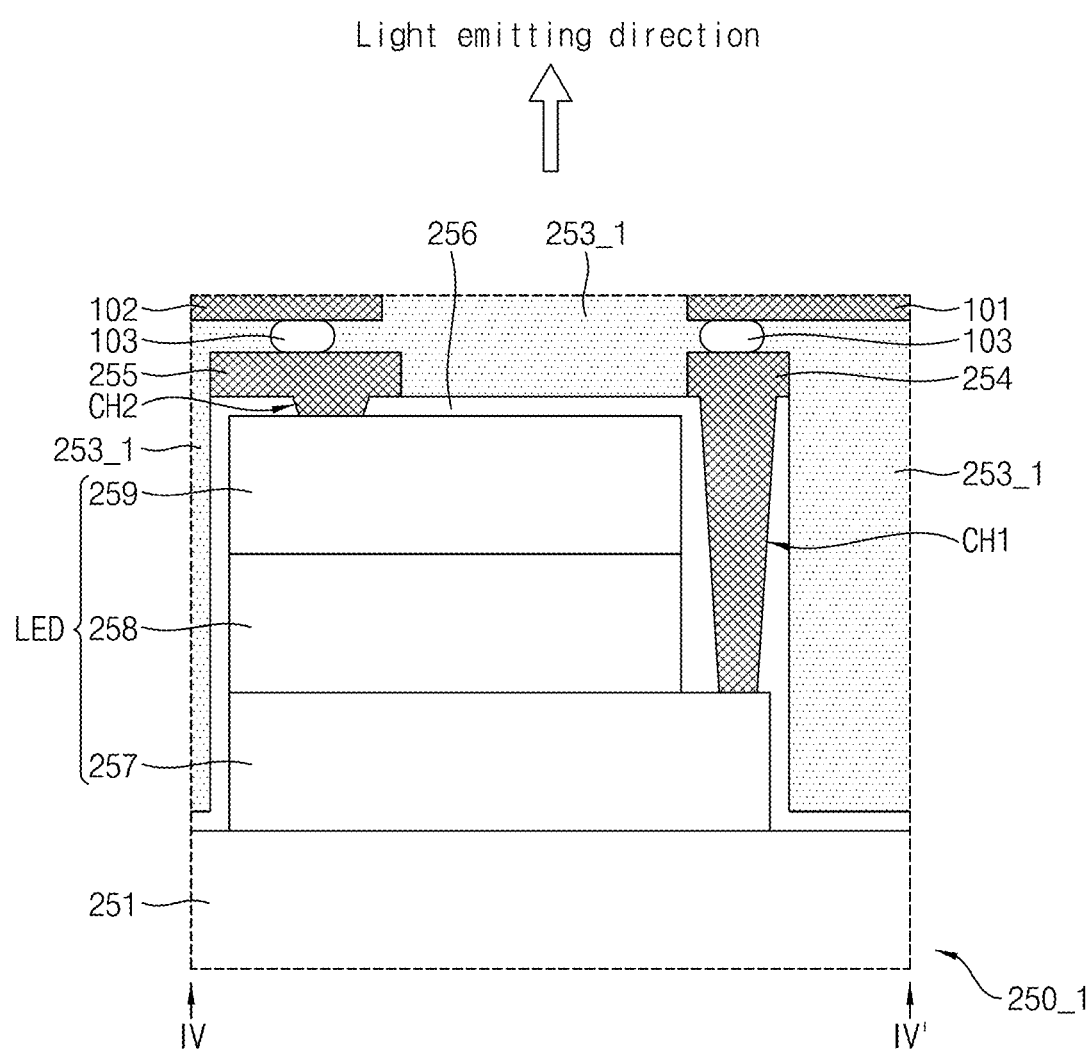
FIG. 16 is a cross-sectional view along line VI-VI' in FIG. 15.

FIG. 12 is a cross-sectional view of a certain area of augmented reality glasses according to an exemplary embodiment of the disclosure.

Referring to FIG. 12, the augmented reality glasses according to this embodiment differ from the augmented reality glasses 20 according to the embodiment of FIG. 8 in that a light emission part 250_1 is disposed between the first optical lens 281 and waveguide 240. That is, in an embodiment, a front surface of the first optical lens 281 may be a curved surface, and a back surface of the first optical lens 281, which contacts a front surface of a waveguide 240, may be a flat surface. The first optical lens 281 may include, at an edge of the back surface thereof, the recess area RA in which the light emission part 250_1 may be disposed. The recess area RA may be disposed between the first optical lens 281 and the waveguide 240. In an embodiment, the second optical lens 282 may not include the recess area RA, different from the first optical lens 281.

Referring to FIGS. 13 to 16, augmented reality glasses 20-1 according to this embodiment differ from the augmented reality glasses according to the embodiment of FIGS. 7 to 10 in that a filling member 253_1 includes a black resin. For example, the black resin may include a function for selectively transmitting light having wavelengths in an infrared band therethrough.

In detail, the filling member 253_1 may be formed throughout an entire surface of the tracking area TA. Light having wavelengths in the visible spectrum may not be allowed to pass through tracking areas TA in the lens part 291/292. Accordingly, the tracking areas TA may be visually recognized as a dark color (e.g., black) by the user 10. In an embodiment, the filling member 253_1 may not be disposed in the display area DA. The filling member 253_1 may provide a sense of unity together with the frame 270 and, as such, may further include an aesthetic function. In addition, it may be possible to minimize visual recognition of a moiré pattern in the tracking areas TA due to the first wiring 101, the second wiring 102, and the light emitting chip LED.

By way of summation and review, a user wearing a head-mounted display cannot visually recognize a physical object in front of the head-mounted display in a powered-off state of the head-mounted display because the head-mounted display shields the user's eyes. Therefore, research regarding wearable augmented reality glasses having a form of glasses different from the head-mounted display have been proposed in order to enable the user to visually recognize a physical object in front of the augmented reality glasses even in a powered-off state, e.g., similarly to general glasses.

Exemplary embodiments of the disclosure provide augmented reality lenses, in which a light emitting chip emits infrared light, and augmented reality glasses and an augmented reality system including the same. That is, according to embodiments of the present disclosure, since infrared light for tracking the user's eye is emitted from the front of the user's eye, tracking accuracy may be increased. In addition, since the light emitting chip is mounted on a flat position in the augmented reality lens, the difficulty of the process of manufacturing the light emitting chip may be reduced relative to the difficulty of the process of manufacturing a frame of augmented reality glasses having a curved surface. Furthermore, since the light emitting chip is mounted in the augmented reality lens, a frame of the augmented reality glasses may be reduced in thickness.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. Augmented reality glasses, comprising:
    a left eye lens part and a right eye lens part, each of the left eye lens part and the right eye lens part including:
        a display area configured to display an augmented reality image, and
        a tracking area surrounding the display area, the tracking area including a plurality of light emission parts configured to emit light having a wavelength in an infrared band; and
    a frame including a left eye lens support area, a right eye lens support area, and a nose bridge connecting the left eye lens support area and the right eye lens support area, the left eye lens support area supporting the left eye lens part, and the right eye lens support area supporting the right eye lens part, wherein:
    at least one of the right eye lens part and the left eye lens part includes a lens having a recess area in which the plurality of light emission parts of the tracking area are disposed.

2. The augmented reality glasses as claimed in claim 1, wherein the tracking area is at an edge of each of the left eye lens part and the right eye lens part.

3. The augmented reality glasses as claimed in claim 2, wherein a width of the tracking area is about 2 mm or less.

4. The augmented reality glasses as claimed in claim 1, wherein each of the plurality of light emission parts includes a light emitting chip of a front emission type.

5. The augmented reality glasses as claimed in claim 4, wherein each of the plurality of light emission parts includes:
    a base substrate;
    the light emitting chip on the base substrate; and
    a first pad and a second pad on the light emitting chip, the first pad and the second pad being at a same level.

6. The augmented reality glasses as claimed in claim 5, wherein the light emitting chip includes:
    an n-type semiconductor layer on the base substrate and electrically connected to the first pad;
    a light emitting layer on the n-type semiconductor layer; and
    a p-type semiconductor layer on the light emitting layer and electrically connected to the second pad.

7. The augmented reality glasses as claimed in claim 5, wherein the light emitting chip is of an epitaxial growth type.

8. The augmented reality glasses as claimed in claim 7, wherein the base substrate includes GaAs.

9. The augmented reality glasses as claimed in claim 5, further comprising:
    bumps on the first pad and the second pad, respectively;
    a first wiring on the bumps and electrically connected to the first pad; and
    a second wiring on the bumps and electrically connected to the second pad, each of the first wiring and the second wiring extending into an interior of the frame.

10. The augmented reality glasses as claimed in claim 9, wherein a width of each of the first wiring and the second wiring is 50 μm to 150 μm.

11. The augmented reality glasses as claimed in claim 9, wherein each of the first wiring and the second wiring is an opaque metal.

12. The augmented reality glasses as claimed in claim 1, wherein:
    each of the left eye lens part and the right eye lens part includes:
    a first optical lens,
    a second optical lens with a corresponding recess area at an edge thereof, and
    a waveguide between the first optical lens and the second optical lens, and for each lens part, each of the plurality of light emission parts is between the waveguide and the second optical lens.

13. The augmented reality glasses as claimed in claim 12, wherein for each lens part, a distance between the second optical lens and an eye of a user when the augmented reality glasses are worn is smaller than a distance between the first optical lens and the eye of the user.

14. The augmented reality glasses as claimed in claim 12, wherein for each lens part, each of the plurality of light emission parts is in the corresponding recess area.

15. The augmented reality glasses as claimed in claim 12, wherein each of the plurality of light emission parts includes:
a base substrate;
a light emitting chip on the base substrate;
a first pad and a second pad on the light emitting chip; and
a filling member on the light emitting chip, the filling member including a resin covering the light emitting chip.

16. The augmented reality glasses as claimed in claim 15, wherein for each lens part, the filling member is filled between the second optical lens and the light emitting chip.

17. The augmented reality glasses as claimed in claim 16, wherein the filling member includes a black resin selectively transmitting light having a wavelength in the infrared band therethrough.

18. Augmented reality glasses, comprising:
a left eye lens part and a right eye lens part, each of the left eye lens part and the right eye lens part including:
a display area configured to display an augmented reality image, and
a tracking area surrounding the display area, the tracking area including a plurality of light emission parts configured to emit light having a wavelength in an infrared band;
a frame including a left eye lens support area, a right eye lens support area, and a nose bridge connecting the left eye lens support area and the right eye lens support area, the left eye lens support area supporting the left eye lens part, and the right eye lens support area supporting the right eye lens part; and
a light receiving part in the nose bridge, the light receiving part being configured to detect light having a wavelength in the infrared band.

19. An augmented reality system, comprising:
a control appliance including a communication module and a control part; and
augmented reality glasses connected to the communication module through a communication network, the augmented reality glasses being configured to display an augmented reality image and to track positions of pupils of a user under a control of the control part,
wherein the augmented reality glasses include:
a left eye lens part and a right eye lens part, each of the left eye lens part and the right eye lens part having:
a display area configured to display the augmented reality image, and
a tracking area surrounding the display area, the tracking area including a plurality of light emission parts configured to emit light having a wavelength in an infrared band, and
a frame including a left eye lens support area, a right eye lens support area, and a nose bridge connecting the left eye lens support area and the right eye lens support area, the left eye lens support area supporting the left eye lens part, and the right eye lens support area supporting the right eye lens part, and
wherein each of the plurality of light emission parts includes:
a base substrate,
a light emitting chip on the base substrate,
a first pad and a second pad on the light emitting chip, the first pad and the second pad being on a same layer, and
a filling member covering the light emitting chip.

20. Augmented reality glasses configured to enable a user to visually recognize an object in front of the augmented reality glasses and configured to display an augmented reality image, the augmented reality glasses comprising:
a first optical lens;
a second optical lens including a recess area at one surface thereof;
a waveguide between the first optical lens and the second optical lens; and
a light emission part between the waveguide and the second optical lens, the light emission part being positioned in the recess area, and the light emission part including:
a base substrate including GaAs,
a light emitting chip on the base substrate, the light emitting chip being of an epitaxial growth type,
a first pad and a second pad on the light emitting chip, and
a filling member on the light emitting chip, the filling member including a resin covering the light emitting chip and filling the recess area.

* * * * *